United States Patent
Iimura et al.

(10) Patent No.: US 6,974,727 B2
(45) Date of Patent: Dec. 13, 2005

(54) METHOD OF MANUFACTURING A HYBRID INTEGRATED CIRCUIT DEVICE

(75) Inventors: Junichi Iimura, Gunma (JP); Katsumi Okawa, Gunma (JP); Yasuhiro Koike, Gunma (JP); Hidefumi Saito, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 97 days.

(21) Appl. No.: 10/183,736

(22) Filed: Jun. 27, 2002

(65) Prior Publication Data

US 2003/0001255 A1 Jan. 2, 2003

(30) Foreign Application Priority Data

Jun. 28, 2001 (JP) ................................. P. 2001-196984

(51) Int. Cl.[7] ............................................. H01L 21/50
(52) U.S. Cl. ....................................................... 438/125
(58) Field of Search ................................ 438/125–128, 438/106, 108; 257/787, 795; 123/634

(56) References Cited

U.S. PATENT DOCUMENTS

| | | | |
|---|---|---|---|
| 4,822,550 A | * | 4/1989 | Komathu .................... 264/263 |
| 6,157,086 A | * | 12/2000 | Weber ........................ 257/788 |
| 6,321,734 B1 | * | 11/2001 | Kaminaga et al. .......... 123/634 |
| 2002/0074652 A1 | * | 6/2002 | Pierce ........................ 257/724 |

FOREIGN PATENT DOCUMENTS

| | | | | |
|---|---|---|---|---|
| EP | 959494 | * | 11/1999 | |
| JP | 02171219 | * | 7/1990 | ............ H01L/21/56 |
| JP | 63253653 | * | 10/1998 | ............ H01L/21/56 |

* cited by examiner

*Primary Examiner*—Craig A. Thompson
(74) *Attorney, Agent, or Firm*—Fish & Richardson P.C.

(57) ABSTRACT

In a molding process, a hybrid integrated circuit substrate is fixed the position of the substrate in a thickness direction. A leadframe is connected, with an upward inclination, to a hybrid integrated circuit substrate and transported into a mold cavity. By horizontally fixing the leadframe by mold dies, the hybrid integrated circuit substrate inclined upward is urged downward by a pushpin. This can fix the position of the hybrid integrated circuit substrate within the mold cavity and integrally transfer-molded.

12 Claims, 13 Drawing Sheets

METHOD OF MANUFACTURING A HYBRID INTEGRATED CIRCUIT DEVICE

BACKGROUND OF THE INVENTION

The present invention relates to a hybrid integrated circuit device and manufacturing method thereof, and more particularly to a hybrid integrated circuit device having a resin seal body formed on a hybrid integrated circuit substrate by transfer molding and to a manufacturing method thereof.

Generally, there are, principally, two methods of sealing employed for hybrid integrated circuit devices.

The first method employs member having such a form as placing a lid, generally called a case member, on a hybrid integrated circuit substrate mounted with circuit elements of semiconductor chips or the like. This structure includes a hollow structure or that having a resin separately filled therein.

The second method is injection molding as a process to mold semiconductor ICs. This is described, e.g. in Japanese Patent Publication No. H11-330317. The injection molding generally uses thermoplastic resin. For example, the resin heated at 300° C. is injected under a high injection pressure and poured into a mold at one time, whereby the resin is molded. Since a resin polymerization time is not required after pouring a resin into a mold, there is a merit to shorten the operation time as compared with transfer molding.

Explanation will be made on a method of manufacturing a conventional hybrid integrated circuit device using injection molding, with reference to FIGS. 10 to 13C.

First, an aluminum (hereinafter, referred to as Al) substrate 1 is employed as a metal substrate as shown in FIG. 10, in order for explanation.

The Al substrate 1 is anodized in its surface. Furthermore, a resin 2 having an excellent insulation property is formed on the entire surface of the anodized Al substrate 1. However, the oxide may be omitted where voltage resistance is not taken into consideration.

As shown in FIGS. 13B and 13C, a resin seal body 10 is formed by a support member 10a and a thermoplastic resin. Namely, a substrate 1 mounted on the support member 10a is covered with thermoplastic resin by injection molding. The support member 10a and the thermoplastic resin have an abutment region. The abutment region of support member 10a is fused by the poured hot thermoplastic resin, thereby realizing a full-mold structure as shown in FIG. 10.

Herein, the thermoplastic resin adopted is a resin called PPS (polyphenyl sulfide).

The injection temperature of thermoplastic resin is as high as 300° C. Consequently, there is a problem that solder 12 be fused by the hot resin thereby causing poor soldering. For this reason, an overcoat 9 is formed by potting a thermosetting resin (e.g. epoxy resin) in a manner previously covering solder joints, metal fine wires 7, active elements 5 and passive elements 6. Due to this, the fine wires (approximately 30–80μm) particularly are prevented from being fallen down and broken under an injection resin pressure during forming with a thermoplastic resin.

The resin seal body 10 is formed through two stages shown in FIGS. 13B and 13C. In the first stage, a gap is provided at between a backside of the substrate 1 and a mold die. The support member 10a is placed on the backside of the substrate, in consideration of securing a thickness at a backside of the substrate 1 upon poring a resin under a high pressure into the gap. In the second stage, the substrate 1 mounted on the support member 10a is covered with a thermoplastic resin by injection molding. In the abutment region between the support member 10a and the thermoplastic resin, the abutment region of the support member 10a is fused by the poured hot thermoplastic resin thereby realizing a full-mold structure. Herein, the thermoplastic resin on the support member 10a preferably has an equivalent thermal expansion to that of the substrate 1.

Next, explanation will be made on a conventional method of manufacturing a hybrid integrated circuit device using injection molding, with reference to FIGS. 11 to 13C.

FIG. 11 is a flowchart, including a metal substrate preparing process, an insulating layer forming process, a Cu foil pressure-laying process, a partial Ni plating process, a Cu foil etching process, a die bonding process, a wire bonding process, a potting process, a lead connection process, a support member attaching process, an injection mold process and a lead cutting process.

FIGS. 12A to 13C show the sectional views of the processes. Note that the processes, that are apparent without showing, are omittedly shown.

At first, FIGS. 12A and 12B show a metal substrate preparing process, an insulating layer forming process, a Cu foil pressure-laying process, a partial Ni plating process and a Cu foil etching process.

In the metal substrate preparing process, prepared is a substrate in consideration of its property of heat dissipation, substrate strength, substrate shield and the like. This example uses an Al substrate 1 having a thickness, e.g. of approximately 1.5 mm, excellent in heat dissipation property.

Next, a resin 2 excellent in insulation property is further formed over the entire surface of the aluminum substrate 1. On the insulating resin 2, a Cu conductor foil 3 is pressure-laid to constitute a hybrid integrated circuit. On the Cu foil 3, an Ni plating 4 is provided over the entire surface in consideration of adhesion to a metal fine wire 7 electrically connecting between the Cu foil 3 as a lead-out electrode and an active element 5.

Thereafter, a known screen-printing is used to form Ni plating 4a and a conductive path 3a.

Next, FIG. 12C shows a die bonding process and a wire bonding process.

On the conductive path 3a formed in the preceding process, an active element 5 and a passive element 6 are mounted through a conductive paste such as a solder paste 12, thereby realizing a predetermined circuit.

Next, FIGS. 13A and 13B show a potting process, a lead connection process and a support member attaching process.

As shown in FIG. 13A, in the potting process, prior to a later injection mold process, potting is previously made with a thermosetting resin (e.g. epoxy resin) onto the solder junctions, metal fine wires 7, active elements 5 and passive elements 6, thereby forming an overcoat 9.

Next, prepared is an outer lead 8 for outputting and inputting signals from and to the hybrid integrated circuit. Thereafter, the outer lead 8 is connected to the external connection terminal 11 formed in a peripheral area of the substrate 1 through a solder 12.

Next, as shown in FIG. 13B, the hybrid integrated circuit substrate 1 connected with the outer lead 8 and the like is mounted on a support member 10a. By mounting the substrate 1 on the support member 10a, it is possible to secure a thickness of a resin seal body at a backside of the substrate 1 during injection molding as explained in the next process.

Next, FIG. 13C shows an injection mold process and a lead cutting process.

As shown in the figure, after potting is done with a thermosetting resin on the substrate 1 to form a overcoat 9, a resin seal body 10 is formed by injection molding. At this time, in the abutment region between the support member 10a and the thermoplastic resin, the abutment region of the support member 10a is fused by the injected hot thermoplastic resin and turned into a full-mold structured resin seal body 10.

Finally, the outer lead 8 is cut to a use purpose thereby adjusting the length of the outer lead 8.

By the above process, a hybrid integrated circuit device is completed as shown in FIG. 10.

On the other hand, in the semiconductor industry, it is a general practice to carry out a transfer mold process. In a hybrid integrated circuit device by the conventional transfer molding, a semiconductor chip is fixed on a leadframe, e.g. of Cu. The semiconductor chip and the lead are electrically connected through a gold wire (hereinafter, referred to as Au). This is because the impossibility of employing an Al fine wire in respect of its less elasticity and ready bendability and time-consumed bonding requiring ultrasonic waves. Consequently, there has not conventionally existed a hybrid integrated circuit device that is formed by one metal plate to have a circuit formed thereon and further the metal substrate wire-bonded by Al fine wires is directly transfer-molded.

In a hybrid integrated circuit device of an injection mold type, there has been a need to prevent the metal fine wire 7 from being bent or broken under an injection pressure during molding, and the solder 12 from flowing at a temperature upon injection molding. For this reason, in the conventional structure shown in FIG. 10, the overcoat 9 due to potting has been adopted in order to cope with the foregoing problem.

However, because injection molding is carried out after potting a thermosetting resin (e.g. epoxy resin) to form an overcoat 9, there is a problem of consuming a material cost for thermosetting resin together with operation cost.

Meanwhile, in the hybrid integrated circuit device by the conventional transfer molding, a semiconductor chip or the like is fixed on an island. Accordingly, although the heat generated from the semiconductor chip or the like dissipates at the fixing region, there is a problem that there is a limitation in heat dissipating area resulting in poor heat dissipation.

Furthermore, because the wire bonding within the resin seal body uses Au wires resistive to resin injection pressure as noted above, it is not a current practice to carry out transfer molding with using Al fine wires. The Al fine wire is readily bent due to the causes of a weak neck resulting from ultrasonic bonding and further too low elastic modulus to withstand under injection pressure.

Furthermore, in the case of integrally sealing hybrid integrated circuit substrates by transfer molding, there is a need to fix the hybrid integrated circuit substrate in horizontal and thickness directions within a mold die. There is a problem that such fixing member has not been developed as to withstand under an injection pressure during molding.

SUMMARY OF THE INVENTION

A problem to be solved by the present invention is to fix a hybrid integrated circuit substrate in a predetermined position within the mold die.

In order to solve the foregoing problem, a hybrid integrated circuit device of the present invention comprises: a hybrid integrated circuit substrate formed of a metal substrate; a lead firmly fixed on the hybrid integrated circuit substrate; and a resin seal body transfer-molding the substrate and the lead; whereby the substrate is provided with a region on which a pushpin for fixing the substrate is to urge during transfer molding.

Furthermore, the region where the pushpin is to urge is arranged in a peripheral region of the substrate. The pushpin can urge a region not provided with a conductor pattern or circuit element.

Furthermore, the substrate and the thermosetting resin are exposed in a bottom of a hole formed by the pushpin. Due to this, by confirming a ratio of the substrate and insulating resin exposed in the hole bottom, it is possible to confirm a position of the substrate in the insulating resin.

A method of manufacturing a semiconductor integrated device of the invention comprises: a step of preparing a hybrid integrated circuit substrate insulation-treated at least in a surface thereof; a step of forming a conductor pattern on the substrate; a step of firmly fixing a semiconductor chip or passive element on the conductor pattern, a step of electrically connecting a lead to the substrate; and a step of molding a thermosetting resin over at least the surface of the substrate by transfer molding.

Meanwhile, the invention is characterized in that, by applying a downward urge force to the hybrid integrated circuit substrate by at least one pushpin, the hybrid integrated circuit substrate is prevented from moving under a pressure of resin injection within the mold cavity. This can fix the position of the hybrid integrated circuit substrate, thus solving the conventionally encountered problem. Furthermore, by fixing the position of the hybrid integrated circuit substrate, the hybrid integrated circuit substrate can be covered, at its back surface, with a constant thickness by using a resin high in heat dissipation property, thereby improving the heat dissipation property on the hybrid integrated circuit device.

Meanwhile, the invention is characterized in that it is possible to confirm an area ratio of the hybrid integrated circuit substrate and thermosetting resin exposed in a hole bottom. This allows to confirm a position of the hybrid integrated circuit substrate within the hybrid integrated circuit device.

DETAILED DESCRIPTION OF THE PREFERRED EMBODIMENT

Explanation will be now made on a hybrid integrated circuit device according to a first embodiment of the invention with reference to FIGS. 1A to 2B.

Figure 1A:
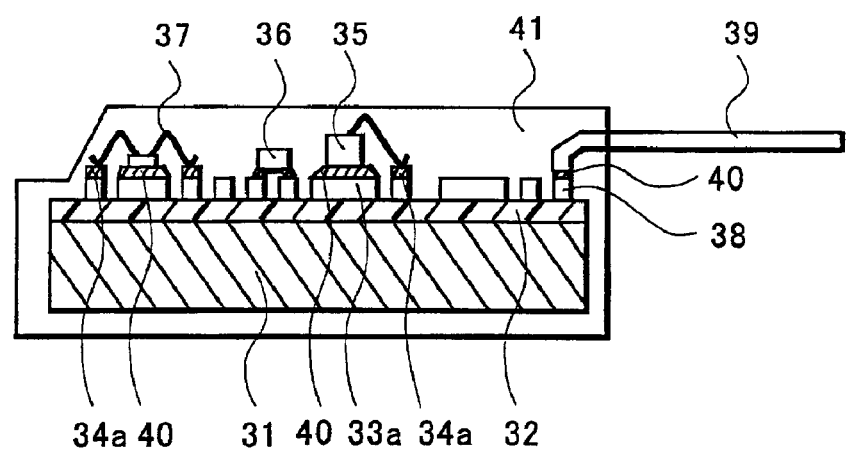
FIG. 1A is a sectional view of a hybrid integrated circuit device of the present invention.
Figure 1B:
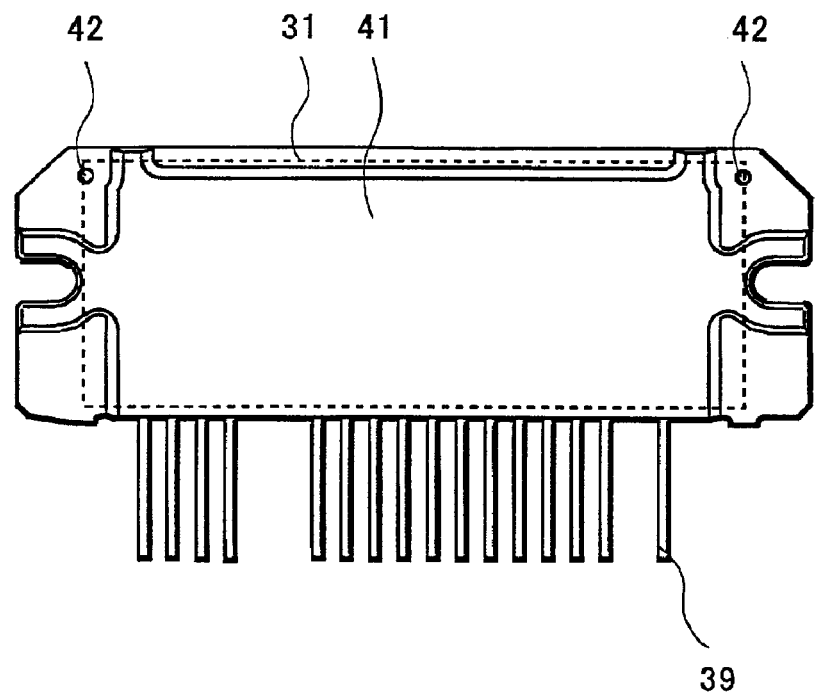
FIG. 1B is a plan view thereof.

Referring to FIGS. 1A and 1B, a structure of the hybrid integrated circuit device will be first explained. As shown in FIG. 1A, a hybrid integrated circuit substrate 31 employs a substrate excellent in heat dissipation property in consideration of the heat generation of from the semiconductor chips fixed on the substrate 31. This embodiment explains a case using an aluminum substrate 31. Note that, although the substrate 31 in the embodiment uses an aluminum (hereinafter, referred to as Al) substrate, this is not necessarily limited to. For example, the embodiment is to be realized in case the substrate 31 uses a printed substrate, a ceramic substrate, a metal substrate or the like. The metal substrate may use a Cu substrate, an Fe substrate, an Fe—Ni substrate, an AlN (aluminum nitride) substrate or the like.

The Al substrate 31 is anodized in its surface, to further form an insulating resin 32 excellent in insulation, e.g. epoxy resin, over the entire surface thereof. Note that this metal oxide may be omitted without problem where voltage resistance is not considered.

On the resin 32, a conductive path 33a is formed by a Cu foil 33 (see FIG. 5). An epoxy resin, for example, is overcoated to protect the conductive path 33a on the Al substrate 31, in a position except for electrical connection points. On the conductive path 33a, an active element 35 such as a power transistor, small-signal transistor or IC, and a passive element 36 such as a chip resistor or chip capacitor, are mounted through a solder 40. Thus, a predetermined circuit is realized. Herein, by providing electrical connection using an Ag paste or the like, soldering may be partly omitted. In the case of mounting face up an active element 35, such as a semiconductor chip, connection is through a metal fine wire 37. For a power semiconductor chip, the metal fine wire 37 uses an Al wire having approximately 150–500 $\mu m\phi$, for example. This is generally called a thick wire. For a semi-power or small-signal semiconductor chip, used is an Al wire having approximately 30–80 $\mu m\phi$, for example. This is generally called a fine wire. An external connection terminal 38, in a peripheral area of the Al substrate 31, is connected with an outer lead 39 of Cu or Fe—Ni through a solder 40.

According to the present invention, a resin seal body is directly formed over active element 35, a passive element 36 and Al wires 37 and the like on the hybrid integrated circuit substrate 31.

Figure 10:
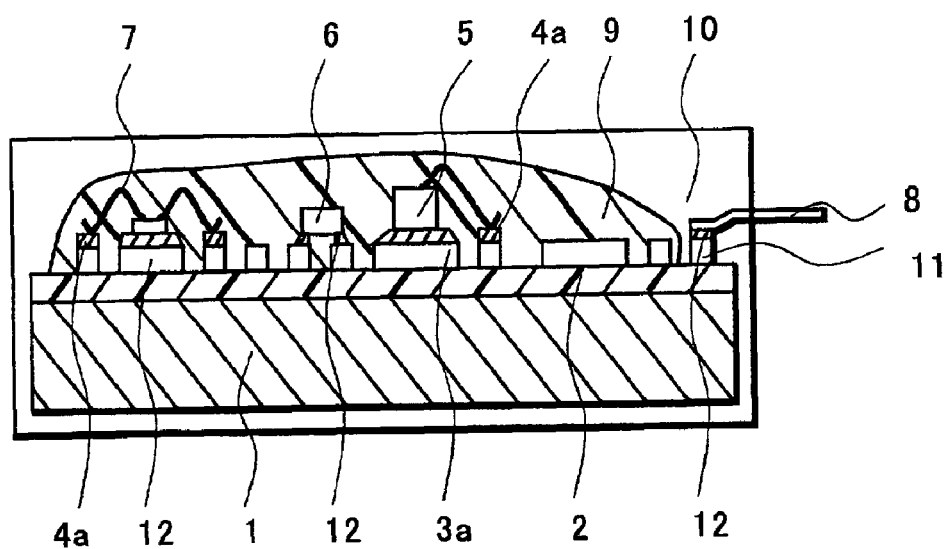
FIG. 10 is a sectional view of a conventional hybrid integrated circuit device.
Figure 11:
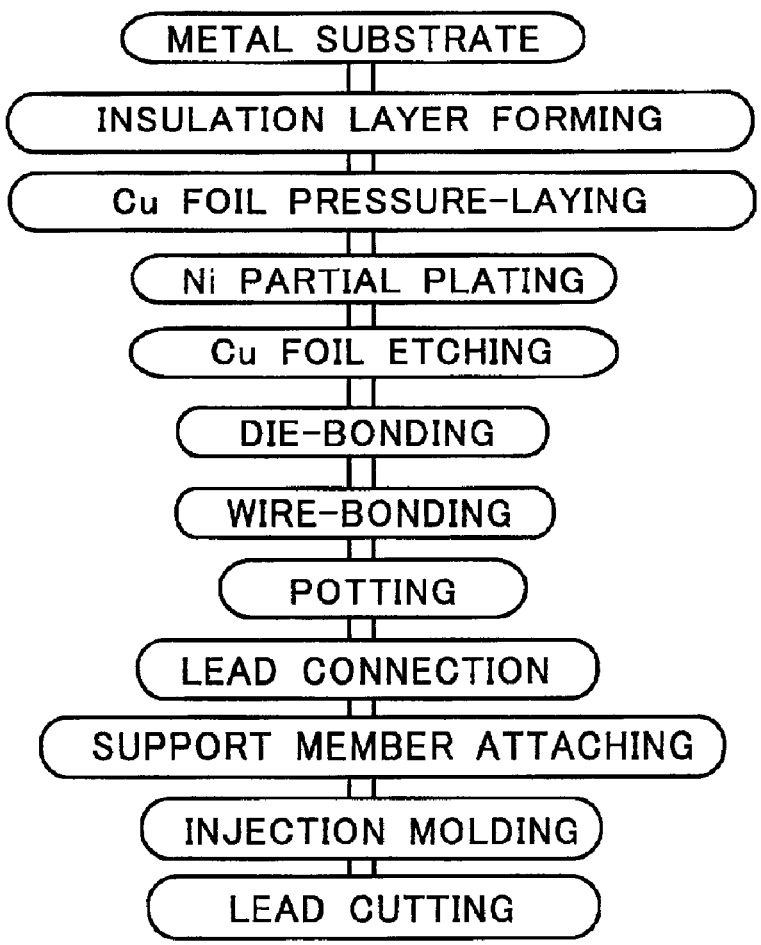
FIG. 11 is a flowchart of a conventional manufacturing method of a hybrid integrated circuit device.
Figure 12A:
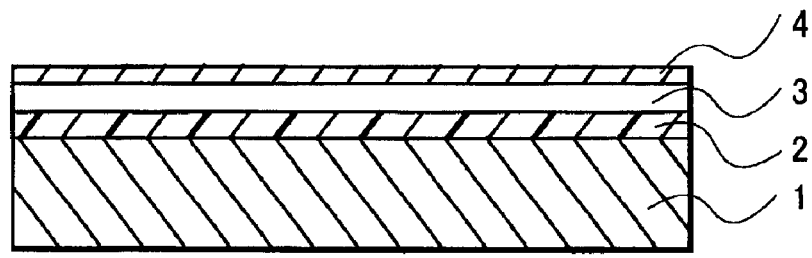
FIGS. 12A to 12C are views explaining the conventional manufacturing method of a hybrid integrated circuit device.
Figure 12B:
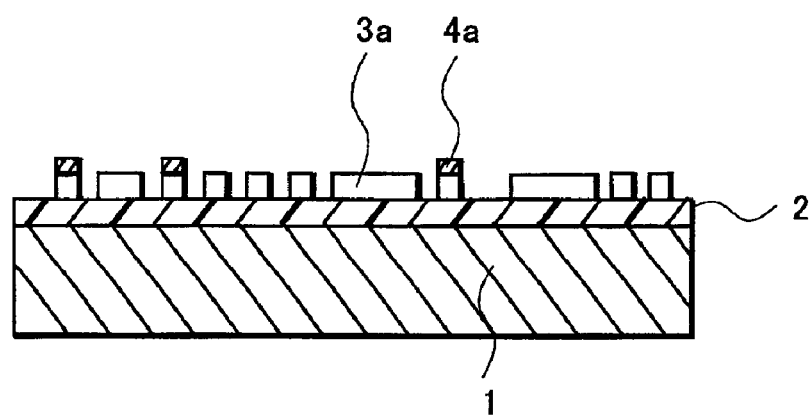
Figure 12C:
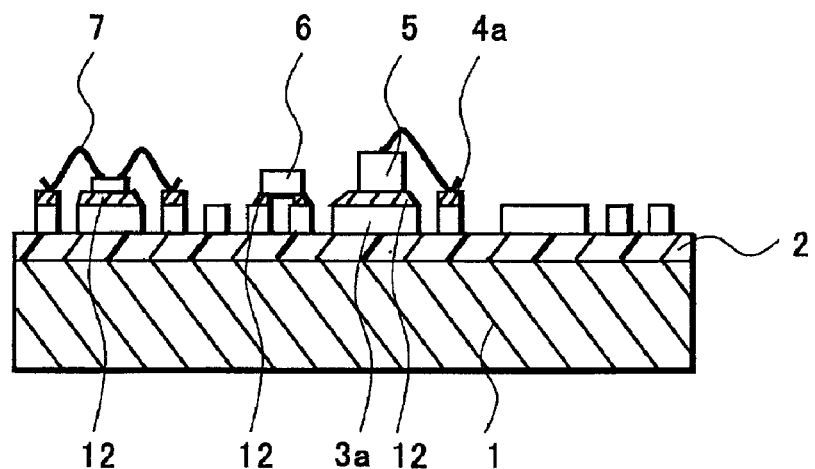
Figure 13A:
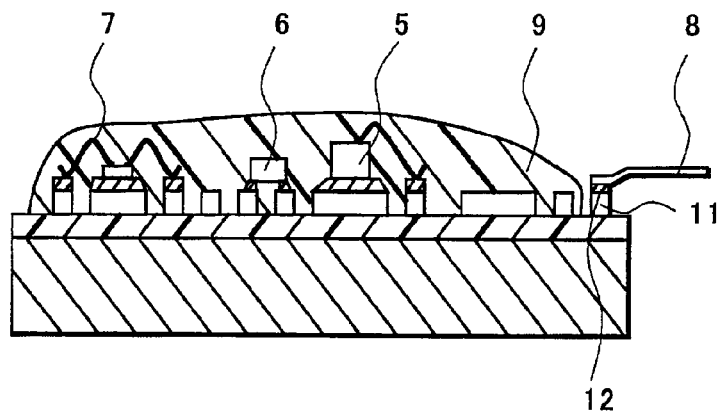
FIGS. 13A to 13C are views explaining the conventional manufacturing method of a hybrid integrated circuit device.
Figure 13B:
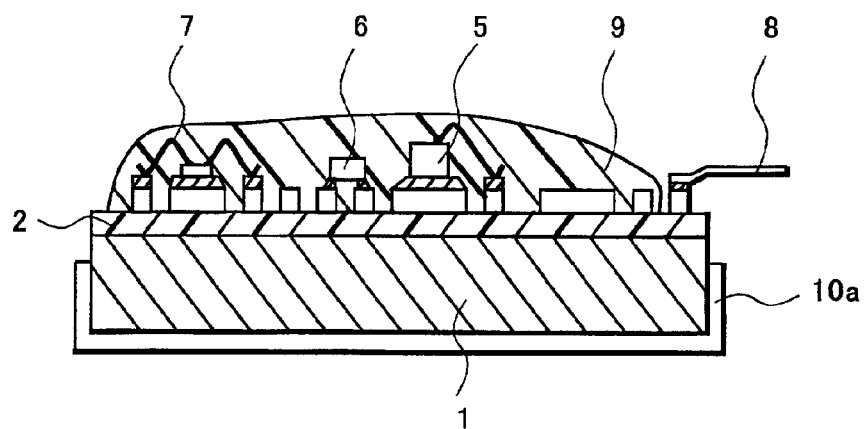
Figure 13C:
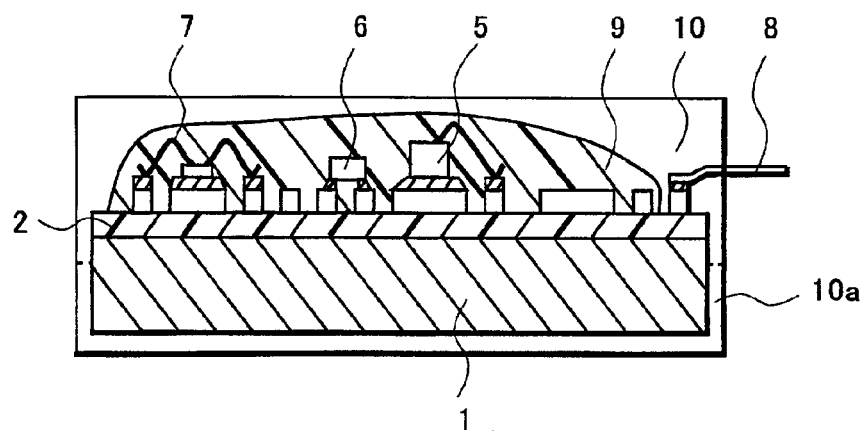

Namely, in the resin seal body 41, the thermosetting resin for use in transfer molding has a low viscosity and a cure temperature lower than a melting point of the solder 40 used in the connection member, e.g. 183° C. This can eliminate the overcoat 9 formed by potting a thermosetting resin (e.g. epoxy resin) required on the conventional hybrid integrated circuit device shown in FIG. 10.

As a result, in case thermosetting resin is poured directly over the metal fine wire having a diameter, e.g. of approximately 40 $\mu m$, electrically connecting the small-signal IC or the like to the conductive path 33a during transfer molding, there is no possibility of falling down, disconnection or bending. A feature of the present invention is that the Al fine wire is prevented from being bent during the molding process.

As shown in FIG. 1B, the outer leads 39 extend externally of the resin seal body 41. The outer leads 39 are adjusted in length in compliance with the purpose of use. Holes 42 are formed as traces of pushpins in the resin seal body 41, at two points close to a side opposite to a side the outer leads 39 extend. The holes 42 are caused by pushpins 47 (see FIG. 6) fixing the substrate 31 during transfer molding, which are left even after forming a resin seal body 41.

Figure 2A:
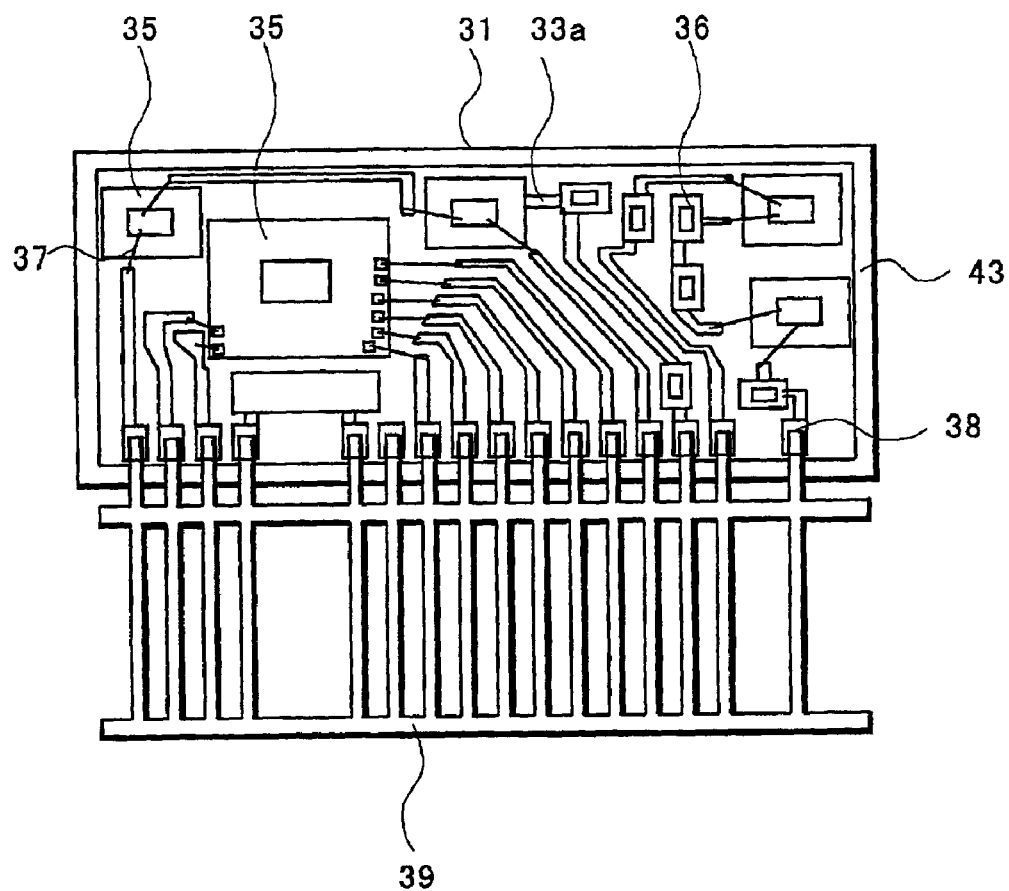
FIG. 2A is a plan view of the hybrid integrated circuit device of the invention.

Referring to FIG. 2A, the holes 42 are formed in a peripheral region 43 of the substrate 31, i.e. in a region not formed with a circuit or the like on the substrate 31. Furthermore, because the holes 42 are formed in the peripheral region of the substrate 31 over the resin film 32, it is structurally free from problem in respect of quality and moisture resistance. Herein, the peripheral region 43 is a margin provided to secure a distance from a circuit area upon individually pressing the substrate 31.

Figure 2B:
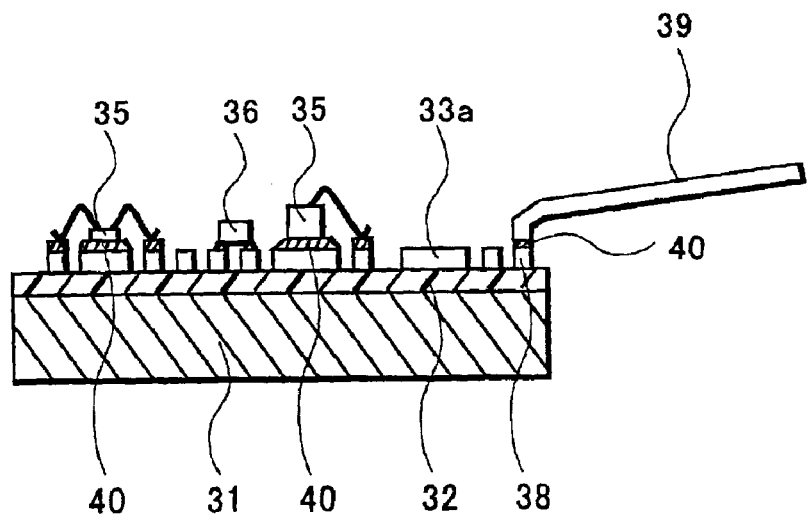
FIG. 2B is a sectional view thereof.

As shown in FIGS. 2A and 2B, a conductive paths 33a is densely formed on the Al substrate 31. On the conductive path 33a, mounted are an active element 35 such as a power transistor, small-signal transistor or IC, and a passive element 36 such as a chip resistance or capacitance through a solder 40 or the like. Meanwhile, outer leads 39 are connected through external connection terminals 38, thereby realizing a predetermined circuit.

As shown in the figure, a complicated circuit is formed within a narrow space on the substrate 31. According to the hybrid integrated circuit device of the invention, after forming an insulating resin 32 over the entire surface of the Al substrate 31, a complicated circuit is formed and thereafter outer leads 39 are bonded to the substrate 31, followed by integrally, directly forming a resin seal body 41 by transfer molding.

In the conventional, where forming a hybrid integrated circuit device by transfer molding, a leadframe of Cu, for example, is worked by etching, punching or pressing to form wiring, lands and the like. It has been impossible to form such a complicated circuit as a conductor pattern of a hybrid integrated circuit. Meanwhile, with a leadframe for transfer molding, when forming a wiring as in FIG. 2A, there is a need of fixing with suspension leads at various points in order to prevent against lead warpage. In this manner, a hybrid integrated circuit using a usual leadframe can mount several active parts at the utmost. Thus, there is a restriction in forming a hybrid integrated circuit having such a conductor pattern as that of FIG. 2A.

Namely, by providing a structure of hybrid integrated circuit device of the invention, a substrate 31 having a complicated circuit can be formed by transfer molding. Furthermore, because the invention uses a substrate having a high thermal conductivity to carry out transfer molding, the heat generated can be dissipated at the entire of the substrate 31. Accordingly, as compared to the hybrid integrated circuit device using the conventional leadframe, the metal substrate 31 directly molded acts as a large-sized heat-sink thus providing excellent heat dissipation and realizing circuit characteristic improvement.

Furthermore, according to the hybrid integrated circuit device of the invention, as shown in FIG. 1B, the thermosetting resin and hybrid integrated circuit substrate is exposed at the bottoms of the two holes 42 formed in a molding process.

Setting is provided in a mold process such that, in the case that the hybrid integrated circuit substrate 31 is fixed in a correct position, the thermosetting resin and the substrate are exposed, e.g., half-and-half in the bottom of the hole 42. Also, where the substrate is not exposed at all in the respective bottoms of the two holes 42, this means that the hybrid integrated circuit substrate 31 has moved in a thickness direction during the mold process.

Accordingly, by confirming the bottoms of the holes 42 after the molding process, it is possible to confirm a position of the hybrid integrated circuit substrate within the thermosetting resin.

Next, explanation will be made on a method of manufacturing a hybrid integrated circuit device of the invention with reference to FIGS. 3 to 9B.

Figure 3:
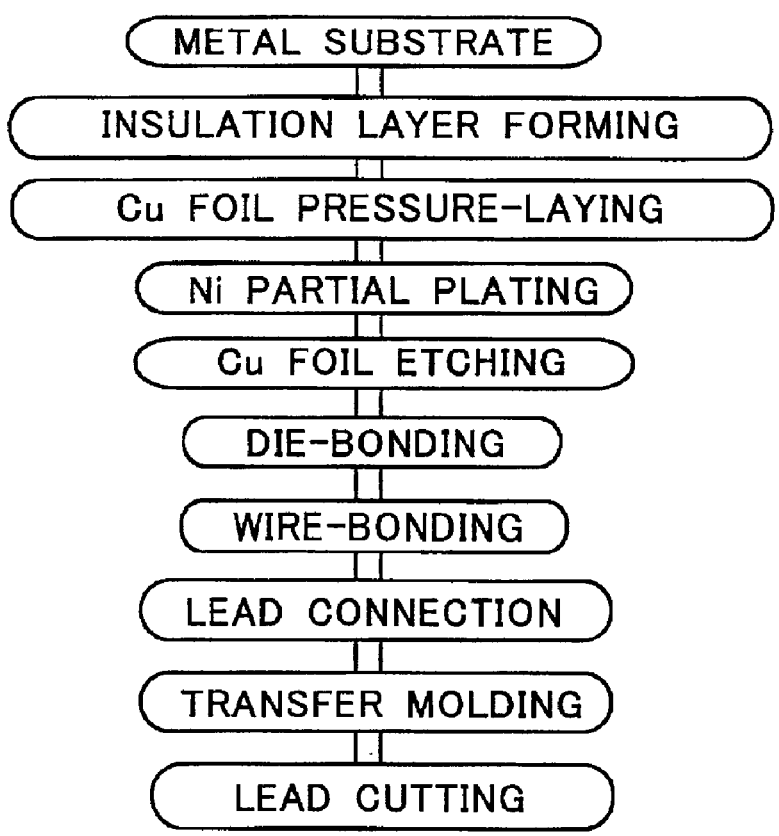
FIG. 3 is a flowchart of a manufacturing method of a hybrid integrated circuit device of the invention.

FIG. 3 is a process flowchart, including a metal substrate preparing process, an insulating layer forming process, a Cu foil pressure-laying process, an Ni partial plating process, a Cu foil etching process, a die bonding process, a wire bonding process, a lead connection process, a transfer mold process, and a lead cutting process. As apparent from the flow, it is a conventional practice to form a resin seal body by injection molding. The invention, however, has realized a process to form a resin seal body by transfer molding.

FIGS. 4A to 9B show the processes of manufacturing hybrid integrated circuit device. Note that the processes, that are apparent without showing, are omitted in the figures.

Figure 4A:
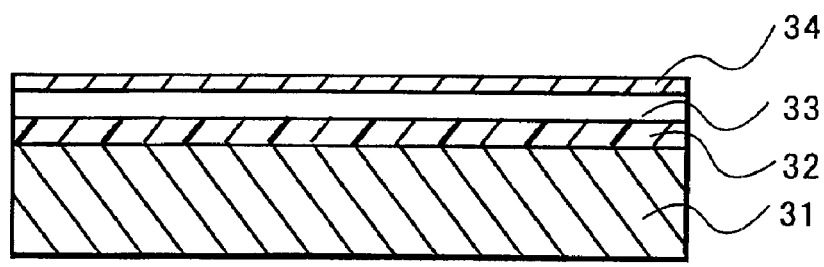
FIGS. 4A to 4C are views explaining the manufacturing method of a hybrid integrated circuit device of the invention.

The first process of the invention includes preparing a metal substrate, forming an insulating layer, pressure-laying a Cu foil and carrying out Ni plating, as show in FIG. 4A.

In the metal substrate preparing process, a substrate is prepared taking into consideration the properties of heat dissipation, substrate strength, substrate shield and so on. In this case, emphasis is placed particularly on heat dissipation property because heat concentration is caused by density increase where densely mounting integrating power transistors, large-scale LSIs, digital signal processing circuits, etc. on one small-sized hybrid IC. The present embodiment explains the case using an Al substrate 31 having a thickness of, e.g. approximately 1.5 mm, that is excellent in heat dissipation property. Although this embodiment explains the case using an Al substrate as the substrate 31, there is no especial limitation.

For example, the present example can be realized by using, as the substrate 31, a print substrate, a ceramic substrate, a metal substrate or the like. It is possible to consider, as a metal substrate, a Cu substrate, an Fe—Ni substrate or a chemical substance of a metal excellent in conductivity.

Next, the aluminum substrate 31 is anodized to cause an oxide in its surface. Furthermore, a resin 32 excellent in insulation property, e.g. epoxy resin, is formed on the entire surface thereof. Note that the metal oxide may be omitted without problem where voltage resistance is not taken into consideration. Then, a Cu conductor foil 33 is pressure-laid on the insulating resin 32, to constitute a hybrid integrated circuit. On the Cu foil 33, Ni plating is provided over the entire surface in consideration of an adhesion to a metal fine wire 37 for electrical connection between the Cu foil 33 for turning into an lead-out electrode and the active element 35.

Figure 4B:
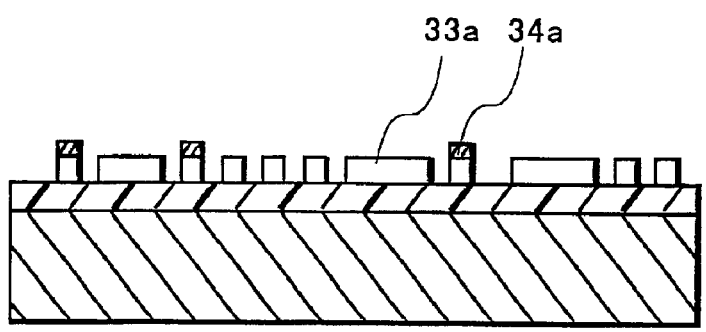

The second process of the invention includes forming Ni plating and etching the Cu foil as shown in FIG. 4B.

On the Ni plating 34, resist is left only in an area requiring Ni plating 34 by known screen-printing or the like to form a selective mask. Then, Ni plating 34a is formed by etching, e.g. in an area for turning into an lead-out electrode, on the Cu foil 33. Thereafter, the resist is removed away. Again, resist is left only in an area requiring a Cu-foil conductor pattern 33a by known screen-printing or the like to form a selective mask. Then, a conductor pattern 33a is formed from Cu foil 33 on the insulating resin 32 by etching. Thereafter, an overcoat is formed of an epoxy resin on the conductor pattern 33a by screen-printing, for example.

Figure 4C:
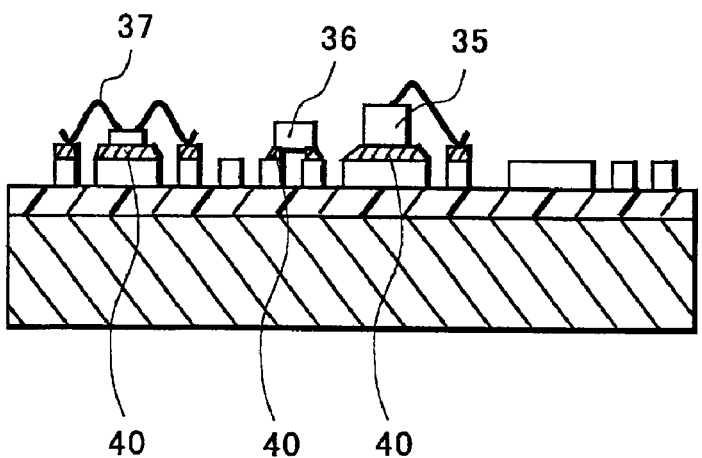

The third process of the invention includes carrying out die bonding and wire bonding, as shown in FIG. 4C.

On the conductor pattern 33a formed in the preceding process, an active element 35 such as a power transistor, a small-signal transistor or IC, and a passive element such as a chip resistor or a chip capacitor, are mounted through a conductive paste, such as a solder paste 40, thereby realizing a predetermined circuit. Herein, by providing electrical connection with an Ag paste or the like, solder may not be partly employed. Meanwhile, when mounting an active element 35, such as a power transistor or a semi-power transistor, a heat-sink is provided between the active element 35 and the conductive path 33a, in consideration of heat dissipation.

Next, in the case of mounting face up an active element 35, such as a semiconductor chip, electrical connection is made through a metal fine wire 37 by bonding. As noted above, the metal fine wire 37 for electrical connection between the active element 35 and the conductive path 33a is wire-bonded through the Ni plating 34 on the conductive path 33a, in consideration of an adhesion to the Cu-foiled conductive path 33a.

Herein, the metal fine wire 37 employs especially an Al fine wire 37. Because an Al wire 37 is difficult in forming a true-sphere ball, a stitch bonding scheme is employed. However, the stitch bonding scheme is featured that a stitch point is readily broken by a resin stress and low in elastic modulus as compared to an Au wire thus readily fallen down under resin pressure. Accordingly, where using an Al wire 37, caution must be paid especially during forming a resin seal body 41.

Figure 5A:
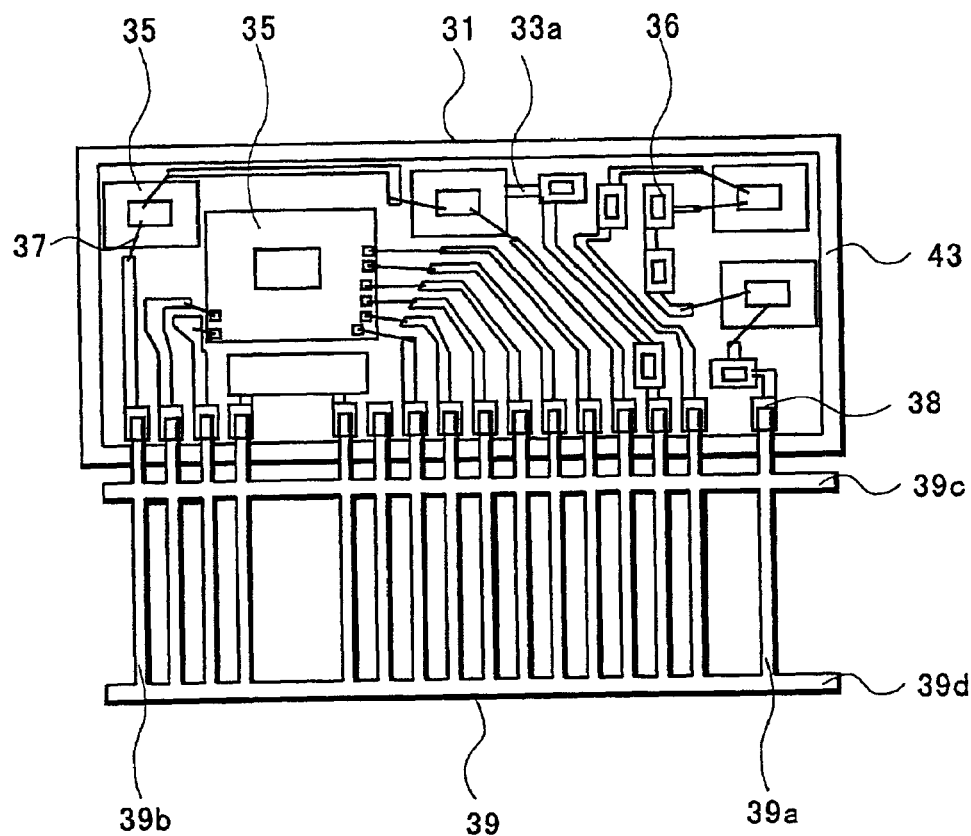
FIGS. 5A and 5B are views explaining the manufacturing method of a hybrid integrated circuit device of the invention.
Figure 5B:
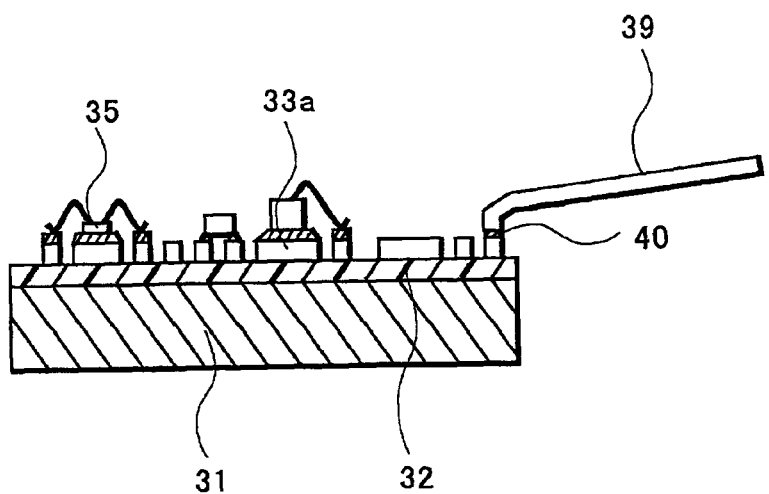

The fourth process of the invention includes carrying out lead connection, as shown in FIGS. 5A and 5B.

As shown in FIG. 5A, prepared is an outer lead 39 for outputting and inputting signals from and to the foregoing hybrid integrated circuit. The outer lead 39 is of a conductor material of Cu, Fe—Ni or the like in order for use as an output-and-input terminal. Furthermore, a width and thickness of the outer lead 39 is determined taking account of a current capacity and the like. The embodiment of the invention, although detailed in the next transfer mold process, requires a strength and springiness in the outer lead 39 and prepares an outer lead 39 having a thickness of approximately, e.g. 0.4–0.5 mm. Thereafter, the outer lead 39 is connected to the external connection terminal 38 formed in the peripheral region of the substrate 31 through a solder 40. In this case, the connecting member is not necessarily limited to solder but connection may be by spot welding.

Herein, as shown in FIG. 5B, according to the invention, the outer leads 39 are connected to the substrate 31 at a somewhat angle relative to a mount surface thereof. The angle defined between the substrate 31 and the lead 39 is to be considered approximately 10°, for example. The cure temperature of a thermosetting resin to be used in the next transfer mold process is set lower than the melting point of a solder 40 for connecting between the outer lead 39 and the external connection electrode 38.

The fifth process of the invention, the process is to integrally mold the hybrid integrated circuit substrate 31 with a thermosetting resin by transfer molding, as shown in FIGS. 6A to 8B.

Figure 6A:
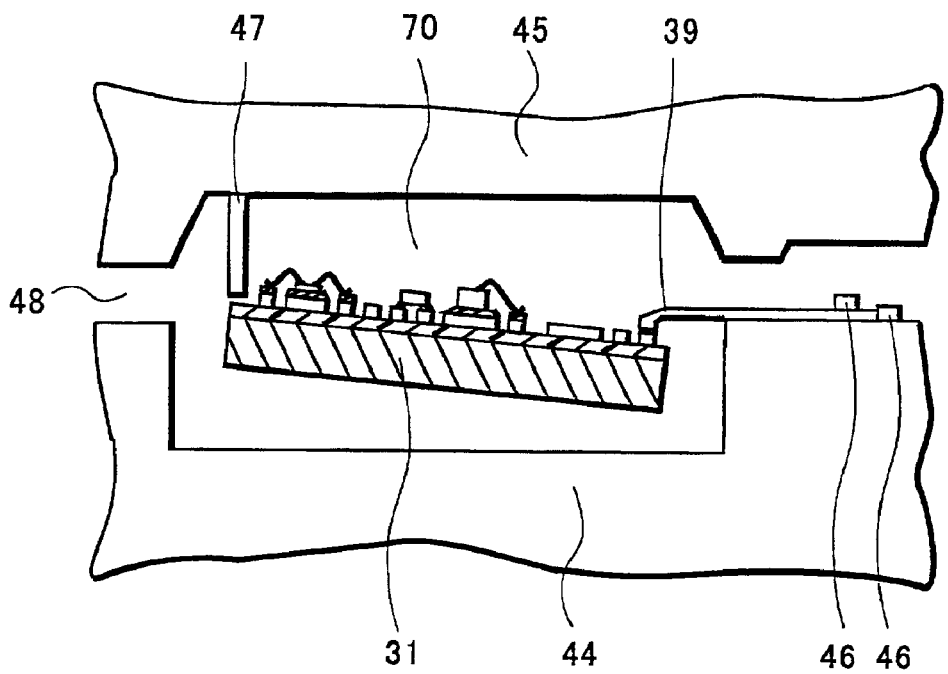
FIGS. 6A and 6B are views explaining the manufacturing method of a hybrid integrated circuit device of the invention.
Figure 6B:
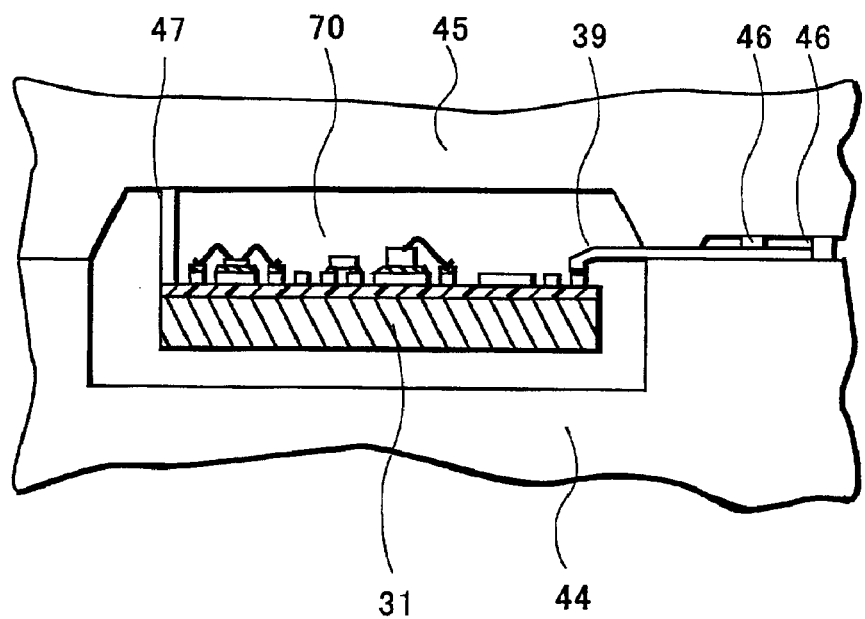

In order to seal the hybrid integrated circuit substrate 31 by transfer molding, the hybrid integrated circuit substrate 31 must be fixed in position within a mold cavity 70, as shown in FIG. 6B. However, in the case of integrally transfer-molding the hybrid integrated circuit substrate 31, there is a difficulty in directly fixing the hybrid integrated circuit substrates 31. Furthermore, there is also a problem that the hybrid integrated circuit substrate 31 be moved under a resin-pouring pressure within the mold.

Accordingly, in this process, the hybrid integrated circuit substrate 31 at a peripheral region is pushed by at least one pushpin 47 provided in an upper mold die 45. Resin is filled after the hybrid integrated circuit substrate 31 is fixed in position within the mold cavity 70.

Specifically, the hybrid integrated circuit substrate 31 soldered with a leadframe 39 is transferred into the mold cavity 70, as shown in FIG. 6A.

Then, as shown in FIG. 6B, the leadframe 39 is fixed by the upper and lower mold dies 45 and 44. The hybrid integrated circuit substrate 31 at a peripheral point is urged by the pushpin 47, thereby fixing the position of the hybrid integrated circuit substrate 31 at within the mold cavity 70.

The leadframe 39 has a plurality of leads connected by a first connecting portion 39d and second connecting portion 39c, as shown in FIG. 5. Furthermore, this is solder-joined to the hybrid integrated circuit substrate 31 not in parallel but with an upward inclination. Accordingly, as shown In FIG. 6A, when the leadframe 39 is horizontally placed, the hybrid integrated circuit substrate 31 assumes an upwardly inclined position within the mold cavity 66.

The pushpin 47 is a projection provided at least one in the upper mold die 45, as shown in FIG. 6A. This acts to urge the hybrid integrated circuit substrate 31 at its peripheral point when the upper and lower mold dies 45 and 44 are fitted together. Meanwhile, the pushpin 47 has a length to horizontally position the hybrid integrated circuit substrate 31 within the mold cavity 70 when it pushes the hybrid integrated circuit substrate 31.

Accordingly, as shown in FIG. 6B, the mold pushpin 47 urges at the peripheral point of the hybrid integrated circuit substrate 31 inclined due to fixing the leadframe 39 in the mold, whereby the hybrid integrated circuit substrate 31 can be fixed in vertical position by an downward urging force of the pushpin 47 and an upward stress of the leadframe 39.

Figure 8A:
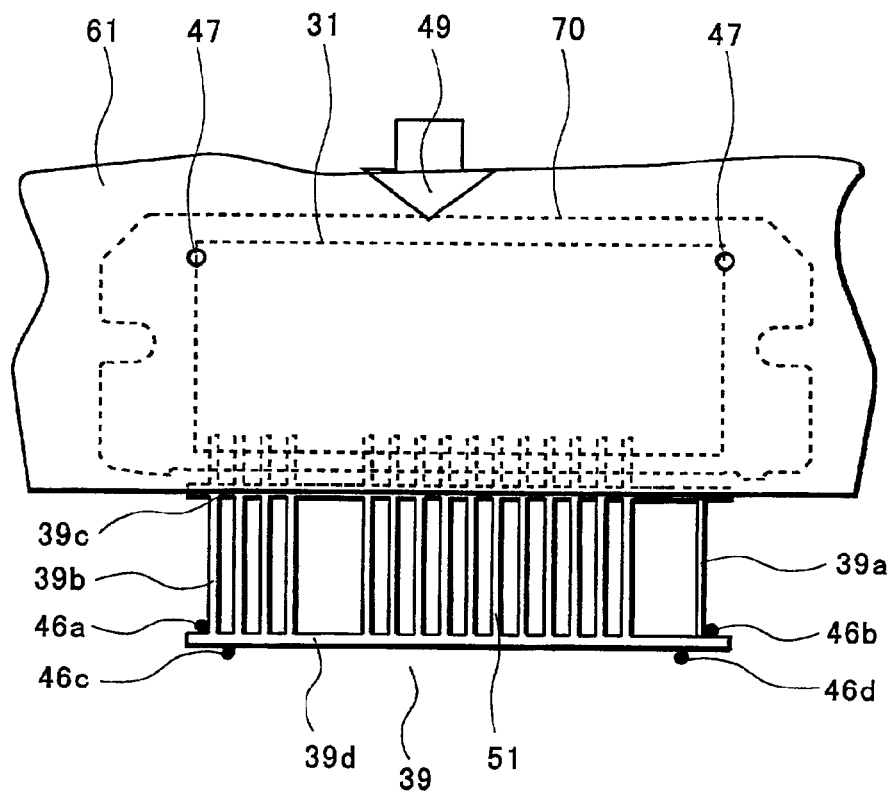
FIGS. 8A and 8B are views explaining the manufacturing method of a hybrid integrated circuit device of the invention.

Also, as shown in FIG. 8A, by abutting a particular point of the leadframe 39 connected to the hybrid integrated circuit substrate 70 against a guide pin 46 provided on the mold, the hybrid integrated circuit substrate 31 can be fixed in horizontal position.

Figure 7A:
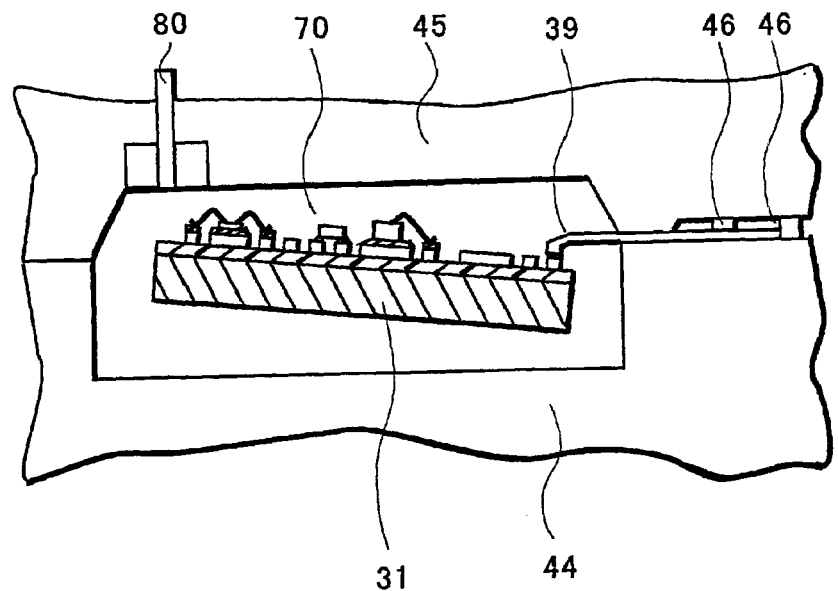
FIGS. 7A and 7B are views explaining the manufacturing method of a hybrid integrated circuit device of the invention.
Figure 7B:
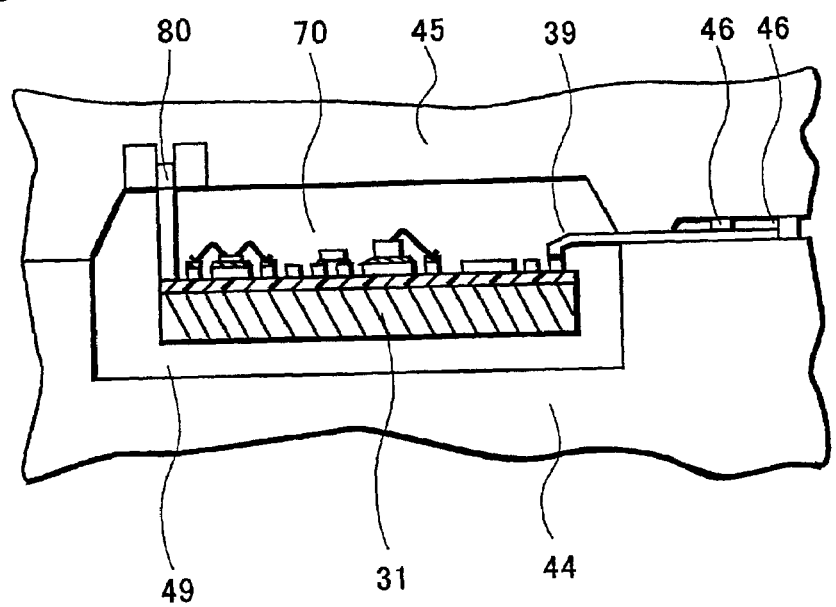

Incidentally, although the hybrid integrated circuit substrate 31 is fixed by using the pushpin 47 fixed on the upper mold die as shown in FIGS. 6A and 6B on the above explanation, there is a method to use a movable pushpin 80 as shown in FIGS. 7A and 7B. Where using a movable pushpin 80, after completing resin pouring, the pin 80 is pulled out and the resin thereafter is cured. Accordingly, the hybrid integrated circuit substrate 31 is free of exposure and hence the hybrid integrated circuit substrate is further improved in moisture resistance.

Figure 8B:
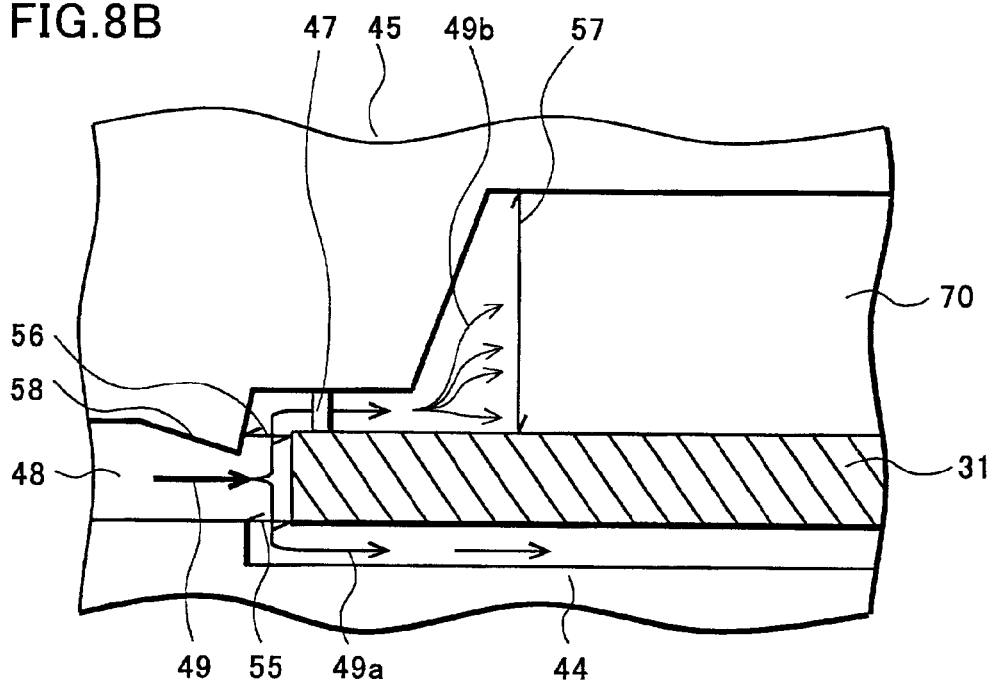

Next, in the manufacturing method of a hybrid integrated circuit device of the invention, a thermosetting resin is injected into the mold cavity 70 such that it first hits a side surface of the substrate 31, as shown in FIG. 8B. Then, the injection thermosetting resin, at an arrow 49, is branched by the substrate 31 to flow toward the upper and the lower of the substrate 31 as shown at arrows 49a, 49b. At this time, a flow width 56 for the upper of the substrate 31 is provided nearly the same as a flow width 55 for the lower of the substrate 31. Thus, the thermosetting resin smoothly flows toward the below of the substrate 31. Furthermore, the thermosetting resin is reduced in injection velocity and pressure by its once hitting at the side surface of the substrate 31. Thus, it is possible to prevent the Al fine wire 37 from being bent or broken.

From the above, the present process can integrally transfer-mold hybrid integrated circuit substrates 31 with using a thermosetting resin.

Figure 9A:
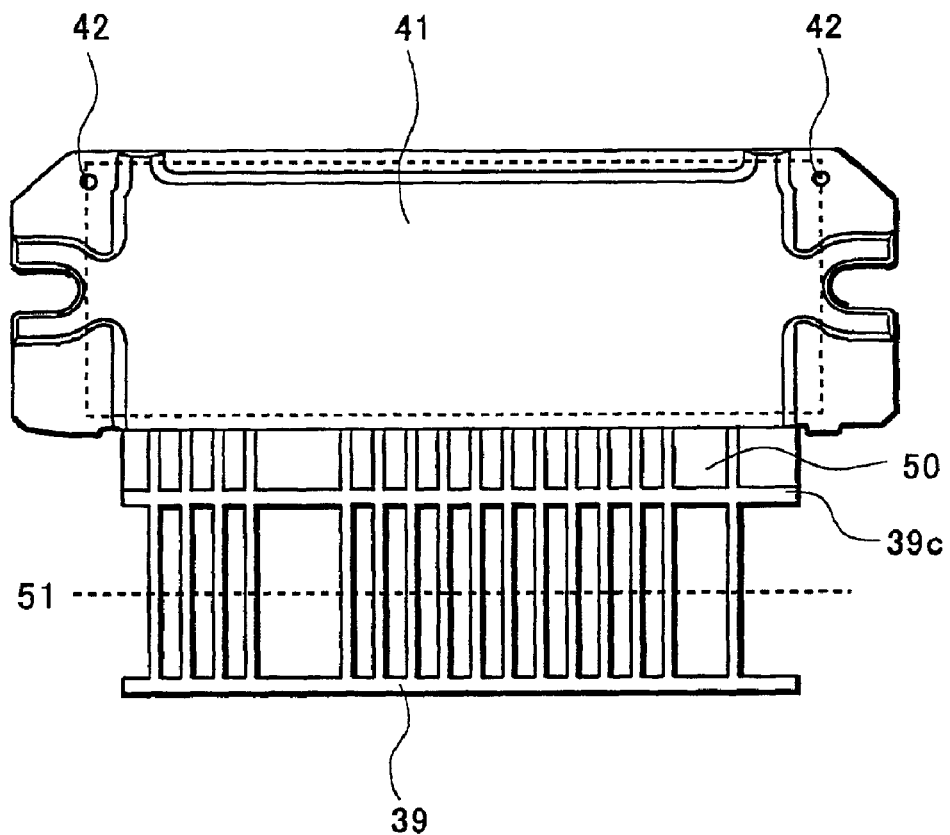
FIGS. 9A and 9B are views explaining the manufacturing method of a hybrid integrated circuit device of the invention.

Meanwhile, as shown in FIG. 6, in the case that the hybrid integrated circuit substrate 31 is urged by a fixed pushpin 47, the hybrid integrated circuit substrate 31 in a peripheral part is exposed at the bottom of a pushpin hole 42 after completing a molding process, as shown in FIG. 9A. However, because the peripheral region of the hybrid integrated circuit substrate 31 is a margin required in blanking the hybrid integrated circuit substrate 31, no conductor patterns, etc. are provided therein. Accordingly, because an overcoat is provided on the hybrid integrated circuit substrate 31 not to expose the metal substrate to the outside, the hybrid integrated circuit device is free from the deterioration in moisture resistance due to the hole 42. Moreover, because the margin region used in pin abutment, the substrate surface is utilized more effectively than the use of a circuit region in abutment.

Furthermore, by confirming an area ratio of the metal substrate 42b and resin 42a exposed in the bottom of the hole 42, it is possible to confirm a presence or absence of a movement of the hybrid integrated circuit substrate 31 in the molding process. Design is made such that, when the substrate 31 is molded in a desired position, the hole 42 bottom is occupied, for example, a half by the hybrid integrated circuit substrate 31. Consequently, where a desired area of the metal substrate is not exposed in the hole 42 bottom, the hybrid integrated circuit substrate 31 is considered having moved horizontally in the molding process. Meanwhile, when there is no exposure of the hybrid integrated circuit substrate 31 in the both bottoms of the two holes 42, the hybrid integrated circuit substrate is considered having moved in a thickness direction in the molding process. From the above, it is possible to determine whether the molding process has been correctly done or not, by confirming the hole 42 bottoms.

Figure 9B:
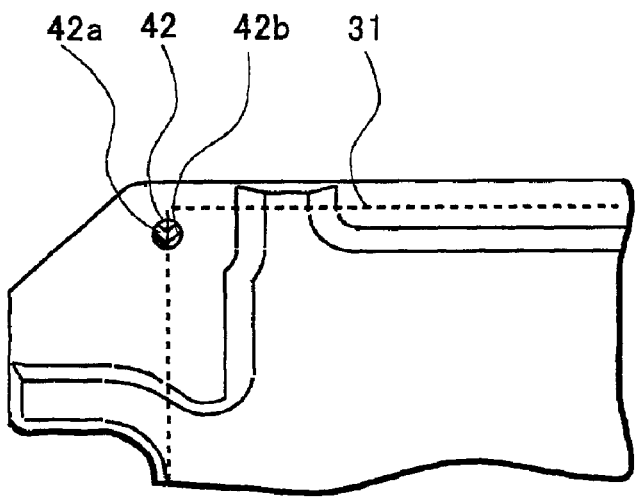

The sixth process of the invention includes cutting the leads, as shown in FIGS. 9A and 9B.

The leaked resin out of the mold dies 44, 45 in the preceding transfer-mold process is dammed at the second connection portion 39c formed on the outer lead 39, and cures as it is. As a result, the area of between the leads of the outer lead 39 closer than the second connection 39c to the resin seal body 41 is filled with leaked resin 50. No resin is filled between the leads closer than the second connection to the tip of the outer lead 39.

By blanking out the second connection 39c portion, individual leads of the outer lead 39 are made independent. The outer lead 39 is adjusted in length in compliance with a use purpose. For, example, the outer lead 39 is cut at a position of a dotted line 51. Simultaneously, the leaked resin 50 also is removed away.

By the above process, a hybrid integrated circuit device shown in FIG. 1 is completed.

As described above, according to the manufacturing method of a hybrid integrated circuit device of the invention, in a transfer-molding process, the hybrid integrated circuit device is fixed in position within the mold by being urged at a peripheral point of the hybrid integrated circuit substrate by the pushpin. Due to this, the manufacturing method of a hybrid integrated device of the invention can omit the use of a support member as required in the conventional manufacturing method of a hybrid integrated circuit device. Furthermore, the hybrid integrated circuit device completed is greatly improved in heat dissipation property.

The hybrid integrated circuit device and manufacturing thereof of the invention was explained on the hybrid integrated circuit device of the full mold type. However, the invention is not limited to the foregoing embodiment. For example, it is possible to form a hybrid integrated circuit device having a shape entirely exposed at a backside of the hybrid integrated circuit substrate. In this case, an effect of heat dissipation is further obtained besides the above-noted effect.

Furthermore, although this embodiment was explained on the case with the one-sided leads that external leads extend at one side surface of the substrate, the invention is not limited to that structure. In the case with double-sided leads or four-way leads, besides the above-noted effect, transfer-mold process can be realized in a state the substrate is stabilized. Besides, various modifications are possible within a range not departing from the gist of the invention.

As explained above, the hybrid integrated circuit device of the invention and manufacturing thereof has the following excellent effects.

By urging a peripheral point of a hybrid integrated circuit substrate by the use of a pushpin provided on the mold die during a molding process, the hybrid integrated circuit substrate can be fixed in position within the cavity of the mold. Furthermore, hybrid integrated circuit substrates can be integrally transfer-molded, the hybrid integrated circuit substrate can be molded, at its surface, in a constant thickness with a thermosetting resin excellent in heat conductivity, making possible to fabricate a hybrid integrated circuit device excellent in heat dissipation property. Incidentally, the use of a pushpin exposes a part of a peripheral region of the hybrid integrated circuit substrate where no conductor patterns are provided. However, because the hybrid integrated circuit substrate has an insulating layer formed on the metal substrate, there is no moisture-resistance deterioration in the hybrid integrated circuit device.

Furthermore, in the invention, by confirming a bottom of a hole formed by the pushpin, it is possible to confirm a position of a hybrid integrated circuit substrate at the inside of the hybrid integrated circuit device. Specifically, by confirming the area ratio of the hybrid integrated circuit substrate and thermosetting resin being exposed to the hole bottom, it is possible to confirm a horizontal position of the hybrid integrated circuit substrate. Meanwhile, by confirming a presence or absence of an exposure of the hybrid integrated circuit substrate, it is possible to confirm a thickness position of the hybrid integrated circuit substrate.

What is claimed is:

1. A method of manufacturing a hybrid integrated circuit device comprising:

preparing a hybrid integrated circuit substrate having an electric circuit electrically connected with a circuit element through a conductor pattern on a face of the substrate;

fixing a conductor member externally extended as a terminal to a desired conductor pattern;

fixing the hybrid integrated circuit substrate in a horizontal position by clamping the conductor member by mold dies;

fixing the hybrid integrated circuit substrate in a vertical position using a urging member equipped with the mold dies; and integrally molding the hybrid integrated circuit by transfer molding using a thermosetting resin.

2. The method of manufacturing a hybrid integrated circuit device according to claim 1, wherein the conductor member is a lead, and the lead is a leadframe to be held as a frame until completing the process of molding.

3. The method of manufacturing a hybrid integrated circuit device according to claim 1, wherein the leadframe, upon being electrically connected to the conductor pattern, is connected with an upward inclination relative to the hybrid integrated circuit substrate.

4. The method of manufacturing a hybrid integrated circuit device according to claim 1, wherein the urging member is at least one pushpin fixed in the mold die.

5. The method of manufacturing a hybrid integrated circuit device according to claim 4, wherein the hybrid integrated circuit substrate is fixed in a vertical position by a downward urge force of the pushpin and an upward stress on the leadframe.

6. The method of manufacturing a hybrid integrated circuit device according to claim 4, wherein the pushpin urges a peripheral region of the hybrid integrated circuit substrate where the conductor pattern and the circuit element are not present.

7. The method of manufacturing a hybrid integrated circuit device according to claim 4, wherein the pushpin urges a peripheral region of the hybrid integrated circuit substrate where an insulating resin is formed.

8. The method of manufacturing a hybrid integrated circuit device according to claim 1, wherein, in the process of transfer molding, a thermosetting resin is injected at a side surface of the mold dies to prevent the hybrid integrated circuit substrate from being moved under an injection pressure of the thermosetting resin.

9. The method of manufacturing a hybrid integrated circuit device according to claim 4, wherein a hole is formed in the integrated circuit device by the pushpin.

10. The method of manufacturing a hybrid integrated circuit device according to claim 9, wherein the thermosetting resin and the hybrid integrated circuit substrate are partly exposed in a bottom of the hole.

11. The method of manufacturing a hybrid integrated circuit device according to claim 9, wherein a position of the integrated circuit device is to be confirmed by confirming an area ratio of the thermosetting resin and hybrid integrated circuit substrate exposed in a bottom of the hole.

12. The method of manufacturing a hybrid integrated circuit device according to claim 9, wherein a position of the integrated circuit device is to be confirmed by confirming a presence of an exposure of the hybrid integrated circuit substrate in a bottom of the hole.

* * * * *